(12) United States Patent
Asami

(10) Patent No.: US 7,385,542 B2
(45) Date of Patent: Jun. 10, 2008

(54) DIGITIZER MODULE, A WAVEFORM GENERATING MODULE, A CONVERTING METHOD, A WAVEFORM GENERATING METHOD AND A RECORDING MEDIUM FOR RECORDING A PROGRAM THEREOF

(75) Inventor: Koji Asami, Tokyo (JP)

(73) Assignee: Advantest Corporation, Tokyo (JP)

( * ) Notice: Subject to any disclaimer, the term of this patent is extended or adjusted under 35 U.S.C. 154(b) by 853 days.

(21) Appl. No.: 10/925,578

(22) Filed: Aug. 25, 2004

(65) Prior Publication Data
US 2005/0017885 A1    Jan. 27, 2005

Related U.S. Application Data

(62) Division of application No. 10/374,769, filed on Feb. 25, 2003, now Pat. No. 6,836,227.

(51) Int. Cl.
*H03M 1/66* (2006.01)
*H03M 1/06* (2006.01)

(52) U.S. Cl. .................. 341/144; 341/118; 341/120

(58) Field of Classification Search .......... 341/144, 341/155, 118, 120; 702/59; 375/326; 386/114
See application file for complete search history.

(56) References Cited

U.S. PATENT DOCUMENTS

| | | | | |
|---|---|---|---|---|
| 5,664,045 | A * | 9/1997 | Park | ............................ 386/114 |
| 6,104,329 | A | 8/2000 | Kawano | |
| 6,115,675 | A * | 9/2000 | Benco et al. | .................. 702/59 |
| 6,384,756 | B1 * | 5/2002 | Tajiri et al. | .................. 341/120 |
| 6,452,518 | B1 | 9/2002 | Kawabata | |
| 6,542,017 | B2 * | 4/2003 | Manganaro | .................. 327/291 |
| 6,545,626 | B1 | 4/2003 | Nakada | |
| 6,567,479 | B1 * | 5/2003 | Alderton | ..................... 375/326 |
| 6,700,515 | B2 | 3/2004 | Asami | |

(Continued)

FOREIGN PATENT DOCUMENTS

JP    2002-340946    11/2002

(Continued)

OTHER PUBLICATIONS

Patent Abstracts of Japan, Publication No. 2002-340946, Publication Date: Nov. 27, 2002, 2 pages.

(Continued)

*Primary Examiner*—Peguy JeanPierre
(74) *Attorney, Agent, or Firm*—Osha-Liang LLP

(57) ABSTRACT

A digitizer module comprises an AD converter for sampling a pair of analog signals at a predetermined time interval and converting into a first and second digital signals respectively, a second signal frequency component calculating unit for calculating a second signal frequency component representing a component of each frequency of the second digital signal on the basis of the second digital signal, a skew frequency component calculating unit for calculating a skew frequency component representing a phase error of each frequency of the second digital signal corresponding to the first digital signal on the basis of a skew of a timing with which the pair of analog signals are sampled by the AD converter and a second signal frequency component correcting unit for correcting the second signal frequency component on the basis of the skew frequency component.

4 Claims, 9 Drawing Sheets

U.S. PATENT DOCUMENTS

| | | | |
|---|---|---|---|
| 7,119,724 B1 * | 10/2006 | Asami | 341/118 |
| 7,218,581 B2 * | 5/2007 | Frisson et al. | 369/44.32 |
| 2004/0008135 A1 | 1/2004 | Asami | |
| 2004/0032358 A1 | 2/2004 | Asami | |

FOREIGN PATENT DOCUMENTS

| | | |
|---|---|---|
| JP | 2004-77192 | 3/2004 |

OTHER PUBLICATIONS

International Search Report for International Application No. PCT/JP2004/001383 mailed on Apr. 13, 2004, 2 pages.

\* cited by examiner

DIGITIZER MODULE, A WAVEFORM GENERATING MODULE, A CONVERTING METHOD, A WAVEFORM GENERATING METHOD AND A RECORDING MEDIUM FOR RECORDING A PROGRAM THEREOF

CROSS-REFERENCE TO RELATED APPLICATIONS

This patent application is a divisional application of U.S. patent application Ser. No. 10/374,769, filed Feb. 25, 2003, now U.S. Pat. No. 6,836,227.

BACKGROUND OF THE INVENTION

1. Technical Field

The present invention relates to a digitizer module, a waveform generating module, a converting method, a waveform generating method and a recording medium for recording a program thereof. More particularly, the present invention relates to a digitizer module for converting a pair of analog signals into a pair of digital signals with equal sample timing, a waveform generating module for outputting a pair of synchronous analog signals and a program and a method of process thereof.

2. Description of the Related Art

As known in the art, with regard to a digitizer module for sampling a pair of analog signals such as quadrature modulated signals to be synchronized each other, there has been a problem that if sampling timings of a pair of AD converters sampling a pair of analog signals do not match each other, quality of observed signals is lowered due to an impairment of orthogonality regarding a result of measuring the two analog signals originally in quadrature.

And also, with regard to a waveform generating module for converting a pair of digital signals to be synchronized each other into analog signals respectively and outputting the signals, if converting timings of a pair of DA converters converting a pair of digital signals into a pair of analog signals respectively do not match each other, quality of outputted signals is lowered due to a phase difference between a pair of analog signals, which are originally synchronized.

In order to prevent the impairment of quality of signal due to the previous problems, an equal-length routing has been used with respect to a clock signal of a pair of DA converters or a pair of AD converters.

The difference of sample timing or converting timing previously described also results from differences between characteristics of AD converters or DA converters and circuits or routing on other signal trace. Consequently, in order to achieve a digitizer module or a waveform generating module with higher precision, it is desirable to prevent the impairment of quality of signal due to these causes, as well as an equal-length routing with respect to a clock signal.

SUMMARY OF THE INVENTION

Therefore, it is an object of the present invention to provide a digitizer module, a waveform generating module, a converting method, a waveform generating method and a recording medium for recording a program thereof, which are capable of solving the problems above. The above and other objects can be achieved by combinations described in the independent claims. The dependent claims define further advantageous and exemplary combinations of the present invention.

According to the first aspect of the present invention, a digitizer module for converting a pair of analog signals into a pair of digital signals with equal sample timing, comprises an AD converter for sampling the pair of analog signals at a predetermined time interval and converting into a first and second digital signals respectively, a second signal frequency component calculating unit for calculating a second signal frequency component representing a component of each frequency of the second digital signal on the basis of the second digital signal, a skew frequency component calculating unit for calculating a skew frequency component representing a phase error of each frequency of the second digital signal corresponding to the first digital signal on the basis of a skew of a timing with which the pair of analog signals are sampled by the AD converter and a second signal frequency component correcting unit for correcting the second signal frequency component on the basis of the skew frequency component.

A digitizer module may further comprise a corrected second signal calculating unit for calculating the second digital signal on which the skew has been corrected on the basis of the second signal frequency component, which is corrected.

The second signal frequency component calculating unit may calculate the second signal frequency component by performing a discrete Fourier-transform on the second digital signal, the skew frequency component calculating unit may calculate a correcting function in a frequency domain for correcting the skew with the skew frequency component and the second signal frequency component correcting unit may correct the second signal frequency component by multiplying the second signal frequency component by the correcting function in the frequency domain.

A digitizer module may further comprise a first signal frequency component calculating unit for calculating a first signal frequency component representing a component of each frequency of the first digital signal on the basis of the first digital signal, wherein the second signal frequency component correcting unit may correct the second signal frequency component on the basis of the skew frequency component and the first signal frequency component.

A digitizer module may further comprise a second signal frequency component calculating unit for calculating a first signal frequency component representing a component of each frequency of the first digital signal on the basis of the first digital signal and a first signal frequency component correcting unit for correcting the first signal frequency component on the basis of the skew frequency component.

A digitizer may further comprise a skew measuring unit for measuring the skew on the basis of an amount of a phase difference between the first and second digital signals, in case a same signal as the pair of analog signals is inputted to the AD converter.

According to the second aspect of the present invention, a digitizer module for converting a pair of analog signals into a pair of digital signals with equal sample timing, comprises an AD converter for sampling the pair of analog signals at a predetermined time interval and converting into a first and a second digital signals, a first digital filter for generating a first converted signal into which the first digital signal is converted on the basis of a predetermined filter coefficient, a correcting filter coefficient generator for generating a correcting filter coefficient correcting a skew, besides a waveform of an impulse response of the correcting filter coefficient is same as the first digital filter, on the basis of the skew of a timing with which the pair of analog signals are sampled by the AD converter and a predetermined filter coefficient and a second digital filter for converting the second digital signal on the basis of the correcting filter coefficient and generating a second converted signal on which the skew is corrected.

The correcting filter coefficient generator may make the correcting filter coefficient be $h(k \cdot T-\tau)$, in case the predetermined filter coefficient is $h(k \cdot T)$ and the skew is $\tau$, where the first digital filter has at least two the predetermined filter coefficient, k denotes an integer in a range of zero to a number one less than the number of the predetermined filter coefficient and T denotes a sampling interval of the AD converter.

According to the third aspect of the present invention, a waveform generating module for outputting a pair of synchronous analog signals, comprises a first digital signal calculating unit for generating a first digital signal on the basis of a first signal frequency component representing a component of each frequency of a first analog signal, which the waveform generating module should output, a second digital signal calculating unit for generating a second digital signal on the basis of a second signal frequency component representing a component of each frequency of a second analog signal, which the waveform generating module should output, a DA converter for converting the first and second digital signals into the first and second analog signals at a predetermined time interval respectively, a skew frequency component calculating unit for calculating a skew frequency component representing a phase error of each frequency of the second analog signal corresponding to the first analog signal, on the basis of a skew of a timing with which the first and second digital signals are converted by the DA converter and a second signal frequency component correcting unit for correcting the second signal frequency component used for generating the second digital signal by the second digital signal calculating unit on the basis of the skew frequency component.

The skew frequency component calculating unit may calculate a correcting function in a frequency domain for correcting the skew with the skew frequency component, the second signal frequency component correcting unit may correct the second signal frequency component by multiplying the second signal frequency component by the correcting function in the frequency domain and the second digital signal calculating unit may generate the second digital signal by performing an inverse discrete Fourier-transform on the second signal frequency component corrected by the second signal frequency component correcting unit.

The second signal frequency component correcting unit may correct the second signal frequency component used for generating the second digital signal by the second digital signals calculating unit, on the basis of the skew frequency component and the first signal frequency component.

A waveform generating module may further comprise a first signal frequency component correcting unit for correcting the first signal frequency component used for generating the first digital signal by the first digital signal calculating unit, on the basis of the skew frequency component.

A waveform generating module may further comprise a skew measuring unit for measuring the skew on the basis of an amount of a phase difference between the first and second analog signals, in case a same signal as the first and second digital signals is inputted to the DA converter.

According to the fourth aspect of the present invention, a waveform generating module for outputting a pair of synchronous analog signals, comprises a first digital filter for generating a first converted signal into which a first digital signal, which represents a signal value of a first analog signal to be outputted, is converted on the basis of a first filter coefficient, a second digital filter for generating a second converted signal into which a second digital signal, which represents a signal value of a second analog signal to be outputted, is converted on the basis of a second filter coefficient, a DA converter for converting the first and second digital signals into the first and second analog signals at a predetermined time interval respectively and a correcting filter coefficient generator for generating the second filter coefficient correcting a skew, besides a waveform of an impulse response of the correcting filter coefficient is same as the first digital filter, on the basis of the skew of a timing with which the DA converter converts the first and second digital signals into the first and second analog signals and the first filter coefficient.

The correcting filter coefficient generator may make the second filter coefficient be $h(k \cdot T-\tau)$, in case the first filter coefficient is $h(k \cdot T)$ and the converting timing error is $\tau$, where the first digital filter has at least two the first filter coefficient, k denotes an integer in a range of zero to a number one less than the number of the first filter coefficient and T denotes a converting interval of the DA converter.

According to the fifth aspect of the present invention, a recording medium for recording a program used for a digitizer module converting a pair of analog signals into a pair of digital signals with equal sample timing is provided, wherein the digitizer module comprises an AD converter for sampling the pair of analog signals at a predetermined time interval and converting the pair of analog signals into a first and second digital signals, and the program allows the digitizer module to function with a second signal frequency component calculating unit for calculating a second signal frequency component representing a component of each frequency of the second digital signal on the basis of the second digital signal, a skew frequency component calculating unit for calculating a skew frequency component representing a phase error of each frequency of the second digital signal corresponding to the first digital signal, on the basis of the skew of a timing with which the pair of analog signals are sampled by the AD converter and a second signal frequency component correcting unit for correcting the second signal frequency component on the basis of the skew frequency component.

According to the sixth aspect of the present invention, a converting method for converting a pair of analog signals into a pair of digital signals with equal sample timing, comprises the steps of sampling the pair of analog signals at a predetermined time interval and converting the pair of analog signals into a first and second digital signals respectively, calculating a second signal frequency component representing a component of each frequency of the second digital signal on the basis of the second digital signal, calculating a skew frequency component representing a phase error of each frequency of the second digital signal corresponding to the first digital signal, on the basis of the skew of a timing with which the pair of analog signals are sampled during the step of sampling and converting and correcting the second signal frequency component on the basis of the skew frequency component.

According to the seventh aspect of the present invention, a recording medium for recording a program used for a digitizer module converting a pair of analog signals into a pair of digital signals with equal sample timing is provided, wherein the digitizer module comprises an AD converter for sampling the pair of analog signals at a predetermined time interval and converting the pair of analog signals into a first and second digital signals, and the program allows the digitizer module to function with a first digital filter for generating a first converted signal into which the first digital signal is converted on the basis of a predetermined filter coefficient a correcting filter coefficient generator for generating a correcting filter coefficient correcting a skew, besides a waveform of an impulse response of the correcting filter coefficient is same as the first digital filter, on the basis of the skew of a timing with which the first and second analog signals are converted by the AD converter and the predetermined filter coefficient and a second digital filter for converting the second digital signal on the basis of the correcting filter coefficient and generating a second converted signal on which the skew is corrected.

According to the eighth aspect of the present invention, a converting method for converting a pair of analog signals into a pair of digital signals with equal sample timing, comprises the steps of sampling the pair of analog signals at a predetermined time interval and converting the pair of analog signals into a first and second digital signals respectively, generating a first converted signal into which the first digital signal is converted on the basis of a predetermined filter coefficient, generating a correcting filter coefficient correcting a skew, besides a waveform of an impulse response of the correcting filter coefficient is same as the step of generating the first converted signal, on the basis of the skew of a timing with which the first and second analog signals are converted by the AD converter and the predetermined filter coefficient and converting the second digital signal on the basis of the correcting filter coefficient and generating a second converted signal on which the skew is corrected.

According to the ninth aspect of the present invention, a recording medium for recording a program used for a waveform generating module outputting a pair of synchronous analog signals is provided, wherein the waveform generating module comprises a DA converter for converting a first and second digital signals into a first and second analog signals at a predetermined time interval respectively, and the program allows the waveform generating module to function with a first digital signal calculating unit for generating the first digital signal on the basis of a first signal frequency component representing a component of each frequency of the first analog signal, which should be outputted by the waveform generating module a second digital signal calculating unit for generating the second digital signal on the basis of a second signal frequency component representing a component of each frequency of the second analog signal, which should be outputted by the waveform generating module a skew frequency component calculating unit for calculating a skew frequency component representing a phase error of each frequency of the second analog signal corresponding to the first analog signal, on the basis of the skew of a timing with which the first and second digital signals are converted by the DA converter and a second signal frequency component correcting unit for correcting the second signal frequency component used for generating the second digital signal by the second digital signal calculating unit, on the basis of the skew frequency component.

According to the tenth aspect of the present invention, a waveform generating method for outputting a pair of synchronous analog signals, comprises the steps of generating a first digital signal on the basis of a first signal frequency component representing a component of each frequency of a first analog signal, which should be outputted, generating a second digital signal on the basis of a second signal frequency component representing a component of each frequency of a second analog signal, which should be outputted, converting the first and second digital signals into the first and second analog signals at a predetermined time interval respectively, calculating a skew frequency component representing a phase error of each frequency of the second analog signal corresponding to the first analog signal, on the basis of a skew of a timing with which the first and second digital signals are converted during the step of converting and correcting the second signal frequency component used for generating the second digital signal during the step of generating the second digital signal, on the basis of the skew frequency component.

According to the eleventh aspect of the present invention, a recording medium for recording a program used for a waveform generating module outputting a pair of synchronous analog signals is provided, wherein the waveform generating module comprises a DA converter for converting a first and second digital signals into a first and second analog signals at a predetermined time interval respectively, and the program allows the waveform generating module to function with a first digital filter for generating a first converted signal into which a first digital signal, which represents a signal value of the first analog signal to be outputted, is converted on the basis of a first filter coefficient, a second digital filter for generating a second converted signal into which a second digital signal, which represents a signal value of the second analog signal to be outputted, is converted on the basis of a second filter coefficient and a correcting filter coefficient generator for generating the second filter coefficient correcting a skew, besides a waveform of an impulse response of the correcting filter coefficient is same as the first digital filter, on the basis of the skew of a timing with which the first and second digital signals converted into the first and second analog signals by the DA converter and the first filter coefficient.

According to the twelfth aspect of the present invention, a waveform generating method for outputting a pair of synchronous analog signals, comprises the steps of generating a first converted signal into which a first digital signal, which represents a signal value of a first analog signal to be outputted, is converted on the basis of a first filter coefficient, generating a second converted signal into which a second digital signal, which represents a signal value of a second analog signal to be outputted, is converted on the basis of a second filter coefficient, converting the first and second digital signals into the first and second analog signals at a predetermined time interval respectively and generating the second filter coefficient correcting a skew, besides a waveform of an impulse response of the second filter coefficient is same as the first digital filter, on the basis of the skew of a timing with which the first and second digital signals converted into the first and second analog signals during the step of converting and the first filter coefficient.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

DETAILED DESCRIPTION OF THE INVENTION

The invention will now be described based on the preferred embodiments, which do not intend to limit the scope of the present invention, but exemplify the invention. All of the features and the combinations thereof described in the embodiments are not necessarily essential to the invention.

Figure 1:
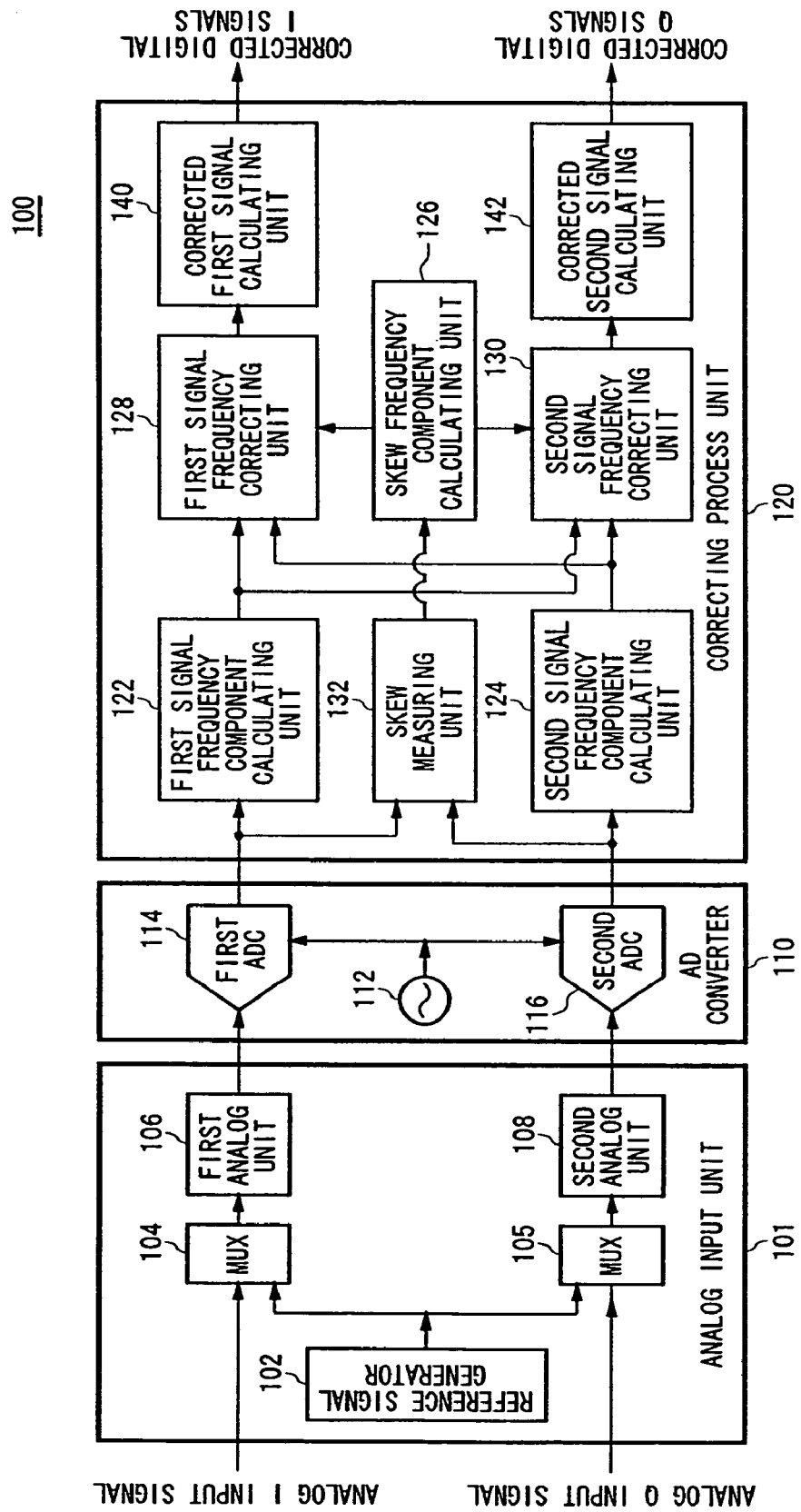
FIG. 1 shows a configuration of a digitizer apparatus 100 relating to the first exemplary embodiment of the present invention.

FIG. 1 shows a configuration of a digitizer apparatus 100 relating to the first exemplary embodiment of the present invention. The digitizer apparatus 100 converts a pair of analog signals to be observed in synchronized state into a pair of digital signals with equal sample timing. The digitizer apparatus 100, with regard to this conversion, corrects an error from sample timing with which a pair of analog signals is converted into digital signals by a digital process so that an impairment of quality of signal can be prevented during digitizing a pair of analog signals. The digitizer apparatus 100 includes an analog input unit 101, an AD converter 110 and a correcting process unit 120.

The analog input unit 101 inputs an analog I input signal and an analog Q input signal in quadrature each other, an example of a pair of analog signals to be observed in the synchronized state. The analog input unit 101 includes a reference signal generator 102 a multiplexer 104, a multiplexer 105, a first analog unit 106 and a second analog unit 108.

The reference signal generator 102 generates a reference signal, which the correcting process unit 120 uses to measures a skew, an error of timing with which a pair of analog signals are sampled by the AD converter 110. The multiplexer 104 and the multiplexer 105 input the same reference signal to the AD converter 110 via the first analog unit 106 or the second analog unit 108, in case the digitizer apparatus 100 measures the skew. And, in case that the digitizer apparatus 100 samples the analog I input signal and the analog Q input signal, The multiplexer 104 and the multiplexer 105 input these signals to the AD converter 110 via the first analog unit 106 or the second analog unit 108. The first analog unit 106 and the second analog unit 108 are an analog circuit, which input the analog I input signal and the analog Q input signal from the multiplexer 104 or the multiplexer 105, for example conduct a conversion of signal level and input the signals to the AD converter 110.

The AD converter 110 samples a pair of analog signals inputted via the analog input unit 101 with a sampling interval, a predetermined time interval, and converts the signals into a first digital signal and a second digital signal. The AD converter 110 includes a reference clock generator 112, a first AD converter 114 and a second AD converter 116.

The reference clock generator 112 generates a sampling clock signal representing sampling timing with which the first AD converter 114 and the second AD converter 116 sample a pair of analog signals inputted from the analog input unit 101. The first AD converter 114 converts the analog I input signal into a digital I signal, an example of the first digital signal on the basis of the sampling clock signal. The second AD converter 116 converts the analog Q input signal into a digital Q signal, an example of the second digital signal on the basis of the sampling clock signal.

The correcting process unit 120 corrects an error of sample timing with respect to a pair of digital signals and outputs a pair of digital signals with equal sample timing. The correcting process unit 120 includes a first signal frequency component calculating unit 122, a second signal frequency component calculating unit 124, a skew frequency component calculating unit 126, a first signal frequency correcting unit 128, a second signal frequency correcting unit 130, a skew measuring unit 132, a corrected first signal calculating unit 140 and a corrected second signal calculating unit 142.

The first signal frequency component calculating unit 122 calculates I signal frequency components, an example of first signal frequency components representing components of each frequency of the digital I signal, on the basis of the digital I signal. The second signal frequency component calculating unit 124 calculates Q signal frequency components, an example of second signal frequency components representing components of each frequency of the digital Q signal, on the basis of the digital Q signal. More particularly, the first signal frequency component calculating unit 122 and the second signal frequency component calculating unit 124 may calculate the I signal frequency components or the Q signal frequency components, the digital I signal or the digital Q signal in frequency domain, by performing discrete Fourier-transform of the digital I signal or the digital Q signal of time domain respectively.

The skew frequency component calculating unit 126 calculates skew frequency components representing phase errors of each frequency of the digital Q signal with respect to the digital I signal, on the basis of a skew of sampling timing with which a pair of analog signals is sampled by the AD converter 110. More particularly, the skew frequency component calculating unit 126 may calculate a correcting function in the frequency domain correcting the skew with the frequency components.

The second signal frequency correcting unit 130 converts components at each frequency with the same sample timing as the I signal frequency components, by correcting the Q signal frequency components on the basis of the skew frequency components calculated by the skew frequency component calculating unit 126. More particularly, the a second signal frequency correcting unit 130 may correct the Q signal frequency components by multiplying the Q signal frequency components by the correcting function in the frequency domain calculated by the skew frequency component calculating unit 126. And, the second signal frequency correcting unit 130 may correct the Q signal frequency components on the basis of the skew frequency components and the I signal frequency components.

The first signal frequency correcting unit 128 converts components at each frequency with the same sample timing as the Q signal frequency components, by correcting the I signal frequency components on the basis of the skew frequency components calculated by the skew frequency component calculating unit 126. More particularly, the a first signal frequency correcting unit 128 may correct the I signal frequency components by multiplying the I signal frequency components by the correcting function in the frequency domain calculated by the skew frequency component calculating unit 126. And, the first signal frequency correcting unit 130 may correct the I signal frequency components on the basis of the skew frequency components and the Q signal frequency components. Here, in case that the second signal frequency correcting unit 130 completely corrects the skew components with respect to the Q signal frequency components, the first signal frequency correcting unit 128 may, without changing the I signal frequency components, output to the corrected first signal calculating unit 140.

The skew measuring unit 132 measures the skew of sampling timing with which a pair of analog signals inputted to the digitizer apparatus 100 is sampled by the AD converter 110, and provides the skew to the skew frequency component calculating unit 126. The skew measuring unit 132 relating to the exemplary embodiment of the present invention measures the skew on the basis of an amount of a phase difference between the digital I signal and the digital Q signal outputted from the first AD converter 114 and the second AD converter 116, in case the same reference signal generated by the reference signal generator 102 with respect to a pair of analog signals is inputted to the AD converter 110.

The corrected first signal calculating unit 140 calculates and outputs corrected digital I signal on which the skew is corrected on the basis of the I signal frequency components corrected by the first signal frequency correcting unit 128. More particularly, the corrected first signal calculating unit 140 converts the I signal frequency components, spectrums of the digital I signal in the frequency domain, corrected by the first signal frequency correcting unit 128, into the corrected digital I signal in the time domain by, for example, performing the inverse discrete Fourier-transform. The corrected second signal calculating unit 142, like the corrected first signal calculating unit 140, calculates and outputs corrected digital Q signal on which the skew is corrected on the basis of the Q signal frequency components corrected by the second signal frequency correcting unit 130.

Next, an exemplary method for correcting the skew will be described with regard to the digitizer apparatus 100.

Letting i(t) and q(t) be the analog I signal and the analog Q signal in the time domain respectively, which is inputted to the digitizer apparatus 100, pi(t) and pq(t) be each sampling clock signal of the analog I signal and the analog Q signal, T be an sampling interval of the first AD converter 114 and the second AD converter 116 and τ be the skew of the first AD converter 114 and the second AD converter 116, pi(t) and pq(t) can be represented as the following equations (1) and (2) respectively:

$$p_i(t) = \sum_{k=-\infty}^{\infty} \delta(t - kT) \quad (1)$$

$$p_q(t) = \sum_{k=-\infty}^{\infty} \delta(t - kT - \tau). \quad (2)$$

If i(t) and q(t) is sampled using pi(t) and pq(t) with regard to the first AD converter 114 and the second AD converter 116, iskew(t) and qskew(t), a sampled digital I signal and a sampled digital Q signal including skew components, are the following equations (3) and (4) respectively:

$$i_{skew}(t) = i(t) \sum_{k=-\infty}^{\infty} \delta(t - kT) \quad (3)$$

$$q_{skew}(t) = q(t) \sum_{k=-\infty}^{\infty} \delta(t - kT - \tau). \quad (4)$$

If the Fourier-transform is performed of iskew(t) and qskew(t) with regard to the first signal frequency component calculating unit 122 and the second signal frequency component calculating unit 124, the I signal frequency components Iskew(f) and the Q signal frequency components Qskew(f) are the following equations (5) and (6) respectively:

$$I_{skew}(f) = I(f) * \frac{1}{T} \sum_{k=-\infty}^{\infty} \delta\left(f - \frac{k}{T}\right) = \frac{1}{T} \sum_{k=-\infty}^{\infty} I\left(f - \frac{k}{T}\right) \quad (5)$$

$$Q_{skew}(f) = Q(f) * e^{-2\pi f \tau} \frac{1}{T} \sum_{k=-\infty}^{\infty} \delta\left(f - \frac{k}{T}\right) \quad (6)$$

$$= \frac{1}{T} \sum_{k=-\infty}^{\infty} Q\left(f - \frac{k}{T}\right) e^{-j2\pi k\tau/T}.$$

Here, letting x(t)=i(t)+j·q(t), a complex signal in the time domain inputted to the digitizer apparatus 100, and X(f)=I(f)+j·Q(f), the Fourier-transform of x(t), Xskew(f), a complex signal in the frequency domain outputted by the first signal frequency component calculating unit 122 and the second signal frequency component calculating unit 124, is the following equation (7):

$$X_{skew}(f) = I_{skew}(f) + jQ_{skew}(f) \quad (7)$$

$$= \frac{1}{T} \sum_{k=-\infty}^{\infty} I\left(f - \frac{k}{T}\right) + j\frac{1}{T} \sum_{k=-\infty}^{\infty} Q\left(f - \frac{k}{T}\right) e^{-j2\pi k\tau/T}.$$

Here, using X(f) and X*(f), the conjugate function of X(f), I(f) and Q(f) are represented as the following equations (8) and (9) respectively:

$$I(f) = \frac{1}{2}\{X(f) + X^*(-f)\} \quad (8)$$

$$jQ(f) = \frac{1}{2}\{X(f) - X^*(-f)\}. \quad (9)$$

From equations(7) and (9), the following equation(10) is derived:

$$X_{skew}(f) = \frac{1}{2T}\sum_{k=-\infty}^{\infty}\left[X\left(f-\frac{k}{T}\right)+X^*\left(-f+\frac{k}{T}\right)+\left(X\left(f-\frac{k}{T}\right)-X^*\left(-f+\frac{k}{T}\right)\right)e^{-j2\pi k\tau/T}\right] \quad (10)$$

$$= \frac{1}{2T}\sum_{k=-\infty}^{\infty}\left[X\left(f-\frac{k}{T}\right)(1+e^{-j2\pi k\tau/T})+X^*\left(-f+\frac{k}{T}\right)(1-e^{-j2\pi k\tau/T})\right].$$

For example, considering the discrete Fourier-transform for k=0 or k=1 with regard to the first signal frequency component calculating unit 122 and the second signal frequency component calculating unit 124, Iskew(f) and Qskew(f), on the basis of equations(5), (6), (8) and (9), are the following equations(11) and (12) respectively:

$$I_{skew}(f) = \frac{1}{2T}\left\{X(f)+X^*(-f)+X\left(f-\frac{1}{T}\right)+X^*\left(-f+\frac{1}{T}\right)\right\} \quad (11)$$

$$jQ_{skew}(f) = \frac{1}{2T}\left\{X(f)-X^*(-f)+\left(X\left(f-\frac{1}{T}\right)-X^*\left(-f+\frac{1}{T}\right)\right)e^{-j2\pi\tau/T}\right\}. \quad (12)$$

In order to eliminate a term X*(−f+1/T) for k=1 from equations(11) and (12), it is corrected that Qskew(f) is multiplied by ej2Πτ/T. Here, Xc(f), a corrected complex signal in the frequency domain, using equation(10) for k=0 or k=1, can be represented as the following equation(13):

$$X_c(f) = I_{skew}(f) + je^{j2\pi\tau/T}Q_{skew}(f) \quad (13)$$

$$= \frac{1}{2}[X_{skew}(f)+X^*_{skew}(-f)+$$

$$\{X_{skew}(f)-X^*_{skew}(-f)\}e^{j2\pi\tau/T}]$$

$$= \frac{1}{2}[X_{skew}(f)(1+e^{j2\pi\tau/T})+X^*_{skew}(-f)(1-e^{j2\pi\tau/T})]$$

$$= e^{j2\pi\tau/T}[X_{skew}(f)\cos(\pi\tau/T)-jX^*_{skew}(f)\sin(\pi\tau/T)].$$

Here, performing the inverse Fourier-transform of [ ]part in equation(13), the following equation(10) is derived:

$$\begin{aligned}Inv\ Fourier\{[X_{skew}(f)\cos(\pi\tau/T)-\\jX^*_{skew}(-f)\sin(\pi\tau/T)]\} &= \cos(\pi\tau/T)x_{skew}(t)-\end{aligned} \quad (14)$$

$$j\sin(\pi\tau/T)x^*_{skew}(t)$$

$$= \cos(\pi\tau/T)\{i_{skew}(t)+$$

$$jq_{skew}(t)\}-$$

$$j\sin(\pi\tau/T)\{i_{skew}(t)-$$

$$jq_{skew}(t)\}$$

$$= \{i_{skew}(t)\cos(\pi\tau/T)-$$

$$q_{skew}(t)\sin(\pi\tau/T)\}+$$

$$\{q_{skew}(t)\cos(\pi\tau/T)-$$

$$i_{skew}(t)\sin(\pi\tau/T)\}$$

-continued
$$= i'(t)+jq'(t).$$

I' (t) and q' (t) in equation(10) represent signals, which deviate from a rectangular coordinate of the digital I signal and the digital Q signal and are in angular rotation on the basis of τ. That is to say, the digital I signal and the digital Q signal are analyzed with converting to I' axis and Q' axis in a coordinate system in which the digital I signal and the digital Q signal are in angular rotation on the basis of τ. In order to adjust I' axis in regard to equation(14) to I axis, Xc(f) is changed to the following equation(15):

$$X_c(f) = e^{-j2\pi\tau/T}[I_{skew}(f)+je^{2\pi\tau/T}Q_{skew}(f)] \quad (15).$$

Equation(15) is applied to the discrete Fourier-transform. Here, the discrete Fourier-transform of xskew(t) is the following equation(16):

$$\left[\int_{-\infty}^{\infty}X_{skew}(t)e^{-2\pi ft}dt\right]_{f=k/NT} = \int_{-\infty}^{\infty}\{i_{skew}(t)p_i(t)+ \quad (16)$$

$$q_{skew}(t)p_q(t)\}e^{-j2\pi ft}dt$$

$$= \sum_{m=0}^{N-1}i_{skew}(mT)e^{-j2\pi kt/N}+$$

$$e^{-j2\pi kt/NT}\sum_{m=0}^{N-1}q_{skew}(mT)$$

$$e^{-j2\pi km/N}$$

$$= DFT_1(k)+e^{-j2\pi kt/NT}DFT_0(k).$$

From equations(15) and (16), the following equation(17) is derived:

$$X\left(\frac{k}{NT}\right) = e^{-j\pi\tau/T}[DFT_1(k)+e^{j2\pi\tau/T}e^{-j2\pi kt/NT}DFT_0(k)] \quad (17)$$

$$= e^{-j\pi\tau/T}[DFT_1(k)+e^{j2\pi\tau(1-k/N)/T}DFT_0(k)].$$

That is, in case equation (17) is provided, the first signal frequency component calculating unit 122 and the second signal frequency component calculating unit 124 perform the discrete Fourier-transform of the digital I signal and the digital Q signal outputted by the first AD converter 114 and the second AD converter 116 and calculate DFTI(k) and DFTQ(k), the I signal frequency components and the Q signal frequency components, respectively. The skew frequency component calculating unit 126 calculates a pair of skew frequency components of e−jΠτ/T and ej2Πτ(1−k/N)/T on the basis of the skew τ. The first signal frequency correcting unit 128 and the second signal frequency correcting unit 130 calculate corrected I signal frequency components and corrected Q signal frequency components on the basis of the skew frequency components. Therefore, The first signal frequency correcting unit 128 and the second signal frequency correcting unit 130 can calculate equation (17).

And, in case the analog I input signal and the analog Q input signal are such as base band signals, a band, the digitizer apparatus 100 should manage, is within ±nyquist frequency. Here, in case the band is limited within the nyquist frequencies, equations corresponding to a negative input signal frequency, which multiply components for k=1, that is, spectrums between the nyquist frequency and a sampling frequency by correcting coefficient ej2Πτ/T1 resulting from equation (13) is multiplied by j·Qskew(f), are the following equations(18-1) and (18-2):

$0 \leq k < N/2$ (0~nyquist frequency)

$$X\left(\frac{k}{NT}\right) = DFT_1(k) + e^{-j2\pi k\tau/NT} DFT_0(k) \quad (18\text{-}1)$$

$N/2 \leq k < N$ (nyquist frequency~sampling frequency)

$$X\left(\frac{k}{NT}\right) = DFT_1(k) + e^{j2\pi\tau/T} e^{-j2\pi k\tau/NT} DFT_0(k) \quad (18\text{-}2)$$
$$= DFT_1(k) + e^{j2\pi\tau(1-k/N)/T} DFT_0(k).$$

Moreover, in this regards, the correcting process unit 120 may use the I signal frequency components and the Q signal frequency components outputted by the first signal frequency correcting unit 128 and the second signal frequency correcting unit 130 as a pair of digital signals with equal sample timing without the corrected first signal calculating unit 140 and the corrected second signal calculating unit 142. And, instead of measuring the skew on the basis of the amount of a phase difference between the digital I signal and the digital Q signal outputted by the first AD converter 114 and the second AD converter 116, the skew measuring unit 132 may, in case the reference signal generator 102 inputs the same reference signal to the AD converter 110, adjust an amount of the correction for an optimum skew by measuring the skew of the digital I signal and the digital Q signal outputted by the corrected first signal calculating unit 140 and the corrected second signal calculating unit 142 after the correction, changing the amount of the correction for the skew set by the skew frequency component calculating unit 126.

Figure 2:
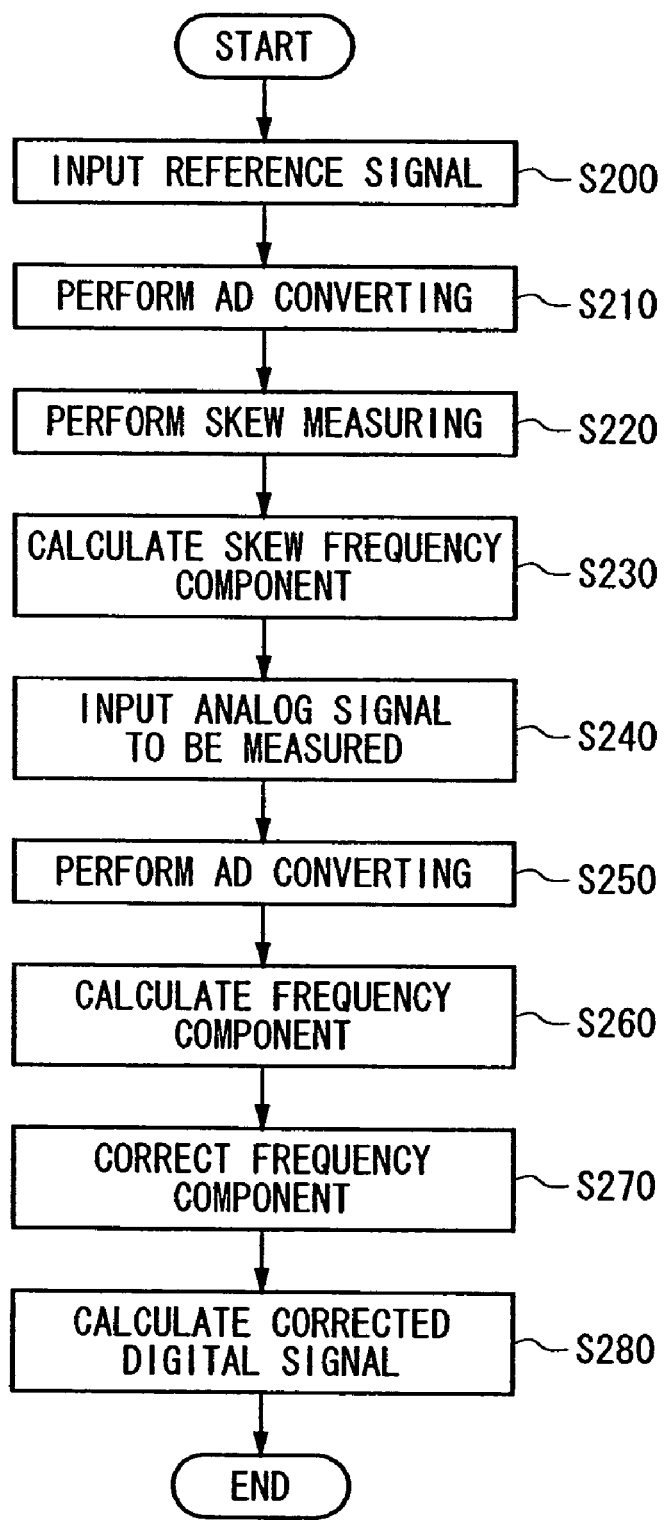
FIG. 2 shows a process flow of a digitizer apparatus 100 relating to the first exemplary embodiment of the present invention.

FIG. 2 shows a process flow of a digitizer apparatus 100 relating to the first exemplary embodiment of the present invention. First, in order to measure the skew of sample timing of the first AD converter 114 and the second AD converter 116, the reference signal generator 102 inputs the reference signal to the first AD converter 114 via the multiplexer 104 and the first analog unit 106, while inputting the same reference signal to the second AD converter 116 via the multiplexer 105 and the second analog unit 108(S200). The first AD converter 114 and the second AD converter 116 convert the reference signal inputted into the digital I signal and the digital Q signal respectively(S210). The skew measuring unit 132 measures the skew on the basis of the amount of the phase difference between the digital I signal and the digital Q signal(S220) And, the skew frequency component calculating unit 126 calculates the skew frequency components representing the phase errors of each frequency of the digital Q signal corresponding to the digital I signal on the basis of the skew measured by the skew measuring unit 132(S230).

Next, the AD converter 110 inputs the analog I signals via the multiplexer 104 and the first analog unit 106, while inputting the analog Q signal via the multiplexer 105 and the second analog unit 108 (S240). And, the first AD converter 114 and the second AD converter 116 in the AD converter 110 sample the pair of analog signals inputted, and convert to the digital I signal and digital Q signal respectively (S250).

Next, the first signal frequency component calculating unit 122 calculates the I signal frequency components on the basis of the digital I signal, and the second signal frequency component calculating unit 124 calculates the Q signal frequency components on the basis of the digital Q signal (S260). And, the first signal frequency correcting unit 128 and the second signal frequency correcting unit 130 correct the I signal frequency components and the Q signal frequency components on the basis of the skew frequency components calculated by the skew frequency component calculating unit 126(S270). And, the corrected first signal calculating unit 140 and the corrected second signal calculating unit 142 calculate the corrected digital I signal and the corrected digital Q signal on which the skew is corrected, on the basis of the corrected I signal frequency components and the corrected Q signal frequency components(S280).

According to the digitizer apparatus 100 described above, the skew of the sampling timing with which a pair of analog signals are sampled by the AD converter 110 can be corrected for a frequency band of the digital signal sampled by the AD converter 110. In addition, a magnitude of the skew during operation is measured by the reference signal generator 102 and the skew measuring unit 132 and the amount of the correction can be adjusted using the magnitude of the skew measured so that the digitizer apparatus 100 with high precision can be achieved.

Figure 3:
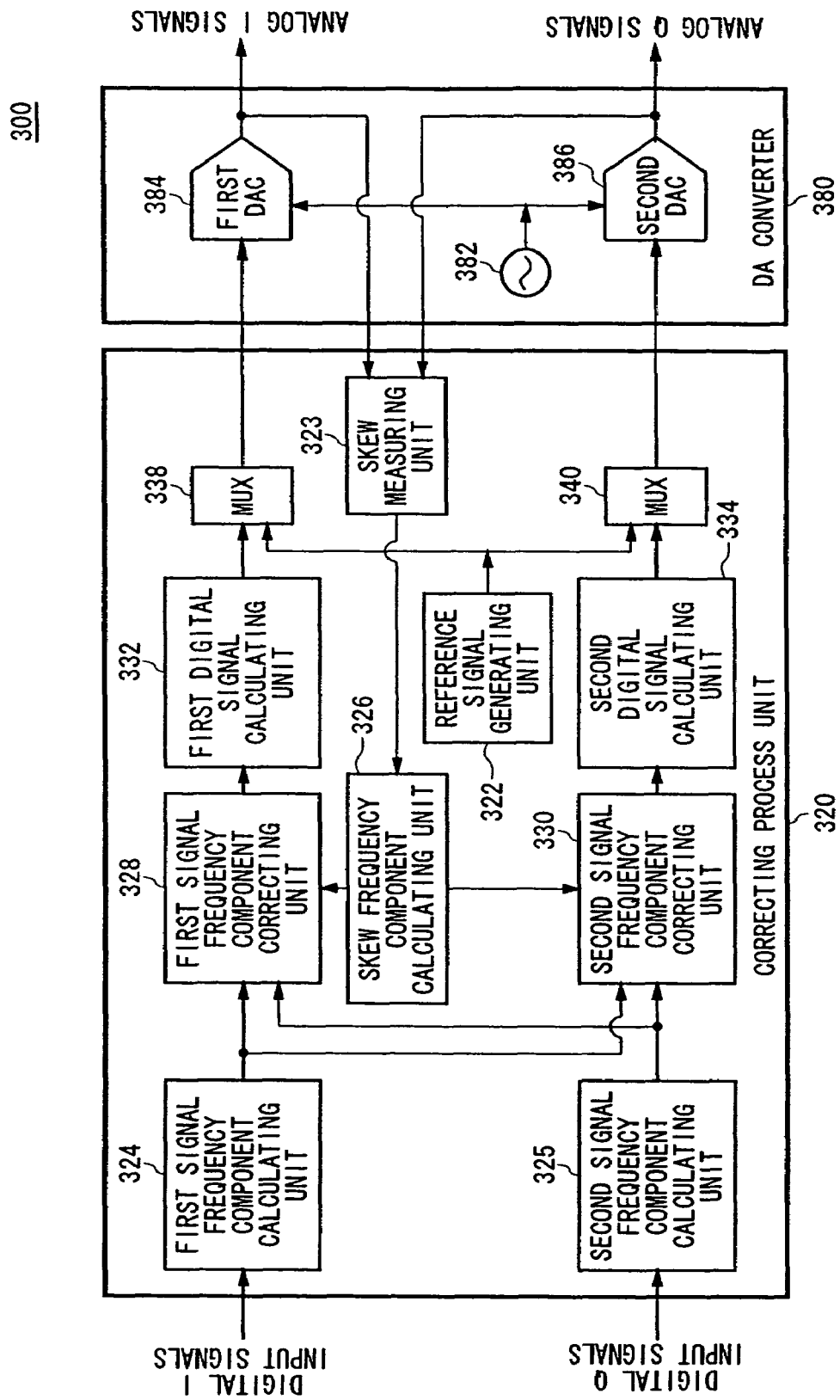
FIG. 3 shows a configuration of a waveform generating apparatus 300 relating to the second exemplary embodiment of the present invention.

FIG. 3 shows a configuration of a waveform generating apparatus 300 relating to the second exemplary embodiment of the present invention. The waveform generating apparatus 300 inputs a pair of digital input signals to be converted into analog signals synchronized, and converts to and outputs a pair of analog signals synchronized. With regard to the conversion, the waveform generating apparatus 300 prevents an impairment of quality of signal during converting a pair of digital input signals to analog signals by correcting an error of converting timing with which a pair of digital input signals are converted into analog signals respectively, with a digital process. The waveform generating apparatus 300 includes a correcting process unit 320 and a DA converter 380.

The correcting process unit 320 inputs digital I input signal and digital Q input signal in quadrature each other, an example of a pair of digital input signals to be converted to analog signals synchronized. The correcting process unit 320 includes a reference signal generator 322, a skew measuring unit 323, a first signal frequency component calculating unit 324, a second signal frequency component calculating unit 325, skew frequency component calculating unit 326, a first signal frequency component correcting unit 328, a second signal frequency component correcting unit 330, a first digital signal calculating unit 332, a second digital signal calculating unit 334, a multiplexer 338 and a multiplexer 340.

The reference signal generator 322 generates a reference signal, which the skew measuring unit 323 uses to measure a skew, an error of timing with which a pair of digital input signals are converted by the DA converter 380. The skew measuring unit 323 measures the skew of the timing with which a pair of digital signals outputted by the correcting process unit 320 to DA converter 380 are converted by the DA converter 380, and provides the skew to the first signal frequency component calculating unit 324. The skew measuring unit 323, according to this exemplary embodiment, inputs the same reference signal generated by the reference signal generator 322 with a pair of digital signals to the DA converter 380 via the multiplexer 338 and the multiplexer 340. And, in this case, the skew measuring unit 323 measures the skew on the basis of an amount of a phase difference between an analog I signal and an analog Q signal, an example of a first analog signal and a second analog signal outputted by a first DA converter 384 and a second DA converter 386 in the DA converter 380.

The first signal frequency component calculating unit 324, a configuration of which is the same as the first signal frequency component calculating unit 122 regarding FIG. 1, calculates I signal frequency components on the basis of the digital I input signal, an original data of the analog I signal to be outputted by the waveform generating apparatus 300. Here, the I signal frequency components are an example of first signal frequency components and represent components of each frequency of the analog I signal to be outputted by the waveform generating apparatus 300. The second signal frequency component calculating unit 325, a configuration of which is the same as the second signal frequency component calculating unit 124 regarding FIG. 1, calculates Q signal frequency components on the basis of the digital Q input signal, an original data of the analog Q signal to be outputted. Here, the Q signal frequency components are an example of second signal frequency components and represent components of each frequency of the analog Q signal to be outputted.

The skew frequency component calculating unit 326, a configuration of which is the same as the skew frequency component calculating unit 126 regarding FIG. 1, calculates skew frequency components representing phase errors of each frequency of the analog Q signal corresponding to the analog I signal, on the basis of the skew of timing with which a corrected digital I signal and a corrected digital Q signal outputted by the correcting process unit 320 are corrected by the DA converter 380. Here, the corrected digital I signal and the corrected digital Q signal are an example of a first digital signal and a second digital signal. More particularly, the skew frequency component calculating unit 326 may calculate a correcting function in the frequency domain correcting the skew with the skew frequency components.

The second signal frequency component correcting unit 330, a configuration of which is the same as the second signal frequency correcting unit 130 regarding FIG. 1, corrects Q signal frequency components, which the second digital signal calculating unit 334 uses to generate a corrected digital Q signal, on the basis of the skew frequency components calculated by the skew frequency component calculating unit 326. More particularly, the second signal frequency component correcting unit 330 may correct the Q signal frequency components by multiplying the Q signal frequency components by the correcting function in the frequency domain calculated by the skew frequency component calculating unit 326. And, the second signal frequency component correcting unit 330 may correct the Q signal frequency components on the basis of the skew frequency components and the I signal frequency components.

The first signal frequency component correcting unit 328, a configuration of which is the same as the first signal frequency correcting unit 128 regarding FIG. 1, corrects I signal frequency components, which the first digital signal calculating unit 332 uses to generate a corrected digital I signal, on the basis of the skew frequency components calculated by the skew frequency component calculating unit 326. More particularly, the first signal frequency component correcting unit 328 may correct the I signal frequency components by multiplying the I signal frequency components by the correcting function in the frequency domain calculated by the skew frequency component calculating unit 326. And, the first signal frequency component correcting unit 328 may correct the I signal frequency components on the basis of the skew frequency components and the Q signal frequency components. Here, in case the second signal frequency component correcting unit 330 completely corrects the skew components with respect to Q frequency components, the first signal frequency component correcting unit 328 may, without changing the I signal frequency components, output to the first digital signals calculating unit 332.

The first digital signal calculating unit 332, a configuration of which is the same as the corrected first signal calculating unit 140 regarding FIG. 1, generating a corrected digital I signal on the basis of the I signal frequency components. More particularly, the first digital signal calculating unit 332 converts the I signal frequency components, spectrums of the digital I input signal in the frequency domain corrected by the first signal frequency component correcting unit 328, into the corrected digital I signal in the time domain by, for example, performing the inverse discrete Fourier-transform. The second digital signal calculating unit 334, a configuration of which is the same as the corrected second signal calculating unit 142 regarding FIG. 1, generating a corrected digital Q signal on which the skew is corrected like the first digital signal calculating unit 332. The multiplexer 338 and the multiplexer 340, in case the skew measuring unit 323 measures the skew, inputs the same reference signal to the DA converter 380. Meanwhile, in case the waveform generating apparatus 300 outputs the analog I signal and the analog Q signal corresponding to the digital I input signal and the digital Q input signal, the corrected digital I signal and the digital Q signal corrected by the first digital signal calculating unit 332 and the second the digital signal calculating unit 334 are inputted to DA converter 380.

The DA converter 380 converts the corrected digital I signal and the digital Q signal into the analog I signal and the analog Q signal with a predetermined converting time interval respectively. The DA converter 380 includes a reference clock generator 382, a first DA converter 384 and a second DA converter 386.

The reference clock generator 382 generates a converting clock signal representing timing with which a pair of corrected digital signals inputted by the correcting process unit 320 are converted by the first DA converter 384 and the second DA converter 386. The first DA converter 384 converts the corrected digital I signal into the analog I signal on the basis of the converting clock signal. The second DA converter 386 converts the corrected digital Q signal into the analog Q signal on the basis of the converting clock signal.

In this regard, description of a method for correcting the skew regarding the first signal frequency component calculating unit 324, the second signal frequency component calculating unit 325, the skew frequency component calculating unit 326, the first signal frequency component correcting unit 328 and the second signal frequency component correcting unit 330 will be omitted, since the method is same as described with regard to FIG. 1 using equations(1) to (18-2).

In addition, the correcting process unit 320 may not include the first signal frequency component calculating unit 324 and the second signal frequency component calculating unit 325. In this case, the correcting process unit 320 may generate the corrected digital I signal and the corrected digital Q signal on the basis of the I signal frequency component and the Q signal frequency component inputted by the first signal frequency component correcting unit 328 and the second signal frequency component correcting unit 330, and output to the DA converter 380.

Figure 4:
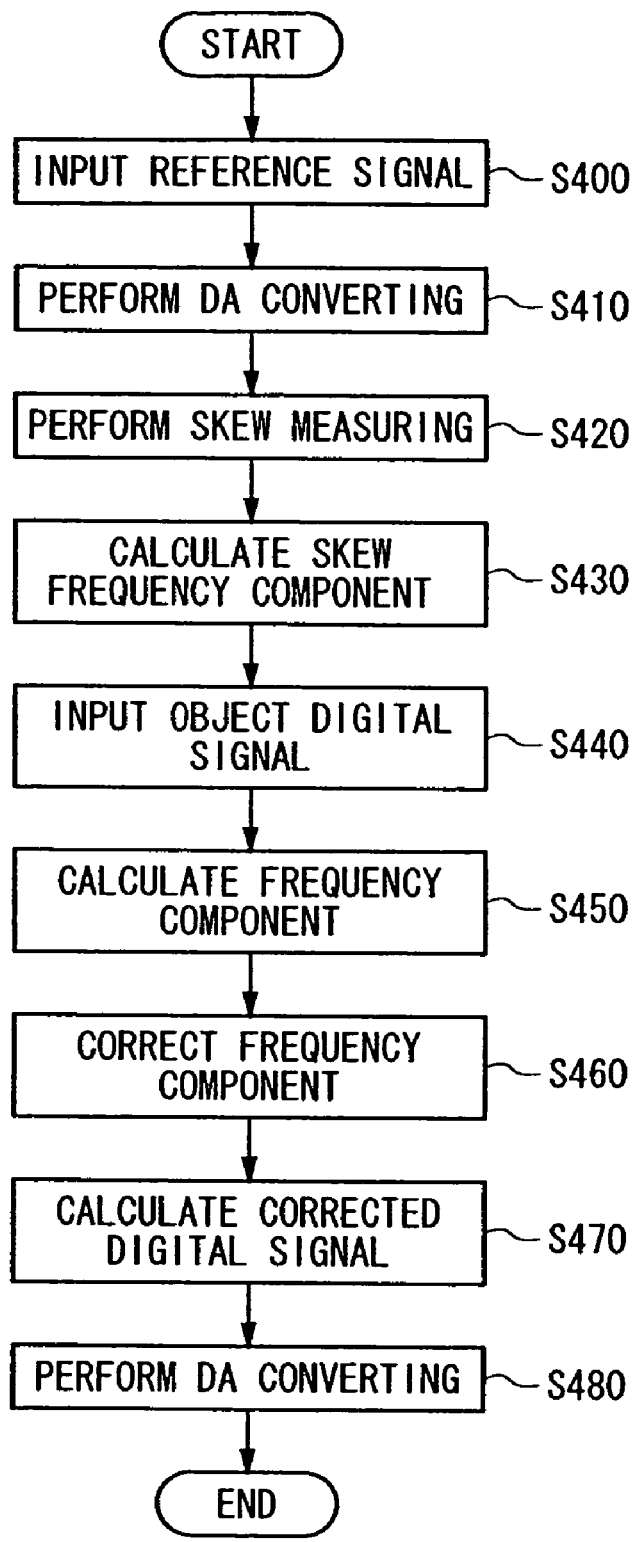
FIG. 4 shows a process flow of a waveform generating apparatus 300 relating to the second exemplary embodiment of the present invention.

FIG. 4 shows a process flow of a waveform generating apparatus 300 relating to the second exemplary embodiment of the present invention. First, In order to measure the skew of converting timing of the first DA converter 384 and the second DA converter 386, the reference signal generator 322 inputs the same reference signal to the first DA converter 384 and the second DA converter 386 via the multiplexer 338 and the multiplexer 340(S400). The first DA converter 384 and the second DA converter 386 convert the reference signal inputted into the analog I signal and the analog Q signal respectively (S410). The skew measuring unit 323 measures the skew on the basis of an amount of a phase difference between the analog I signal and the analog Q signal (S420). And the skew frequency component calculating unit 326 calculates the skew frequency components representing phase errors of each frequency of the analog Q signal corresponding to the analog I signal on the basis of the skew measured by the skew measuring unit 323(S430).

Next, the first signal frequency component calculating unit 324 and the second signal frequency component calculating unit 325 input the digital I input signal and the digital Q input signal to be converted into the analog signals synchronized respectively(S440). And, the first signal frequency component calculating unit 324 and the second signal frequency component calculating unit 325 calculate the I signal frequency components and the Q signal frequency components respectively on the basis of the digital I input signal and the digital Q input signal(S450). Next, the first signal frequency component correcting unit 328 and the second signal frequency component correcting unit 330 correct the I signal frequency components and the Q signal frequency components on the basis of the skew frequency components calculated by the skew frequency component calculating unit 326(S460). Next, the first digital signals calculating unit 332 and the second digital signals calculating unit 334 calculate the corrected digital I signal and the corrected digital Q signal on which the skew is corrected on the basis of the corrected I signal frequency components and the Q signal frequency components respectively (S470). And, the first DA converter 384 and the second DA converter 386 convert the corrected digital I signal and the corrected digital Q signal on which the skew is corrected into the analog I signal and the analog Q signal respectively (S480).

According to the digitizer apparatus 100 described above, the skew of the sampling timing with which a pair of digital signals are sampled by the AD converter 380 can be corrected for digital signals in frequency domain corresponding to analog signals. In addition, a magnitude of the skew during operation is measured by the reference signal generator 102 and the skew measuring unit 132 and the amount of the correction can be adjusted using the magnitude of the skew measured so that the digitizer apparatus 100 with high precision can be achieved.

Figure 5:
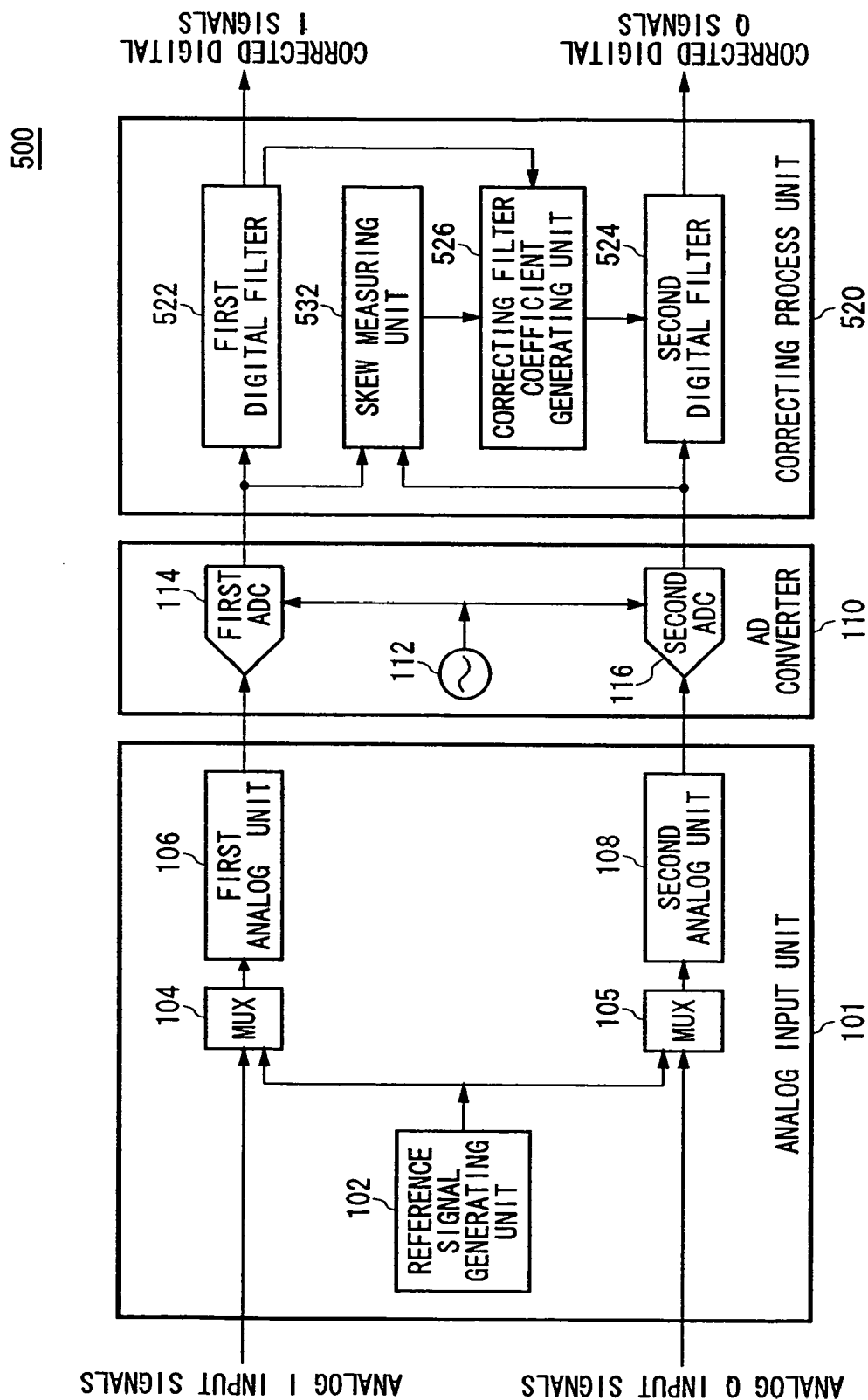
FIG. 5 shows a configuration of a digitizer apparatus 500 relating to the third exemplary embodiment of the present invention.

FIG. 5 shows a configuration of a digitizer apparatus 500 relating to the third exemplary embodiment of the present invention. The digitizer apparatus 500 converts a pair of synchronous analog signals to be observed into a pair of digital signals with equal sample timing. With regard to the conversion, the digitizer apparatus 500 prevents an impairment of quality of signal during digitizing a pair of analog signals by correcting an error of sample timing with which a pair of analog signals are converted into digital signals respectively with a digital filter. The digitizer apparatus 500 includes an analog input unit 101, an AD converter 110 and a correcting process unit 520. Description about the analog input unit 101 and the AD converter 110 with regard to FIG. 5 will be omitted, since a configuration thereof is the same as the analog input unit 101 and the AD converter 110 shown in FIG. 1.

The correcting process unit 520 corrects an error of converting timing and converts to a pair of digital signals with equal converting timing, while performing a predetermined filtering process on the pair of digital signals outputted by the AD converter 110. The correcting process unit 520 includes a first digital filter 522, a correcting filter coefficient generator 526, a second digital filter 524 and a skew measuring unit 532.

The first digital filter 522 converts a digital I signal inputted by the AD converter 110, an example of a first digital signal, on the basis of a predetermined filter coefficient and generates a converted digital I signal, an example of a first converted signal. Here, the first digital filter 522 may have a filter coefficient with which performing the filtering process such as a band-rejection filtering and a band-pass filtering on the digital I signal.

The correcting filter coefficient generator 526 generates a correcting filter coefficient correcting the skew of the first AD converter 114 and the second AD converter 116, besides a waveform of an impulse response of the correcting filter coefficient is same as the first digital filter 522, on the basis of the skew of timing with which a pair of analog signals inputted to the analog input unit 101 are sampled by the AD converter 110 and the filter coefficient set in the first digital filter 522.

The second digital filter 524 converts a digital Q signal inputted by the AD converter 110, an example of a second digital signal, on the basis of a correcting filter coefficient generated by the correcting filter coefficient generator 526 and generates a converted digital Q signal, an example of a second converted signal.

The skew measuring unit 532 measures the skew of timing with which a pair of analog signals inputted to the analog input unit 101 are sampled by the AD converter 110 and provides the skew to the correcting filter coefficient generator 526. The skew measuring unit 532 according to this exemplary embodiment, in case the same reference signal generated by the reference signal generator 102 with a pair of analog signals is inputted to the AD converter 110, measures the skew on the basis of an amount of a phase difference between the digital I signal and the digital Q signal outputted by the first AD converter 114 and the second AD converter 116.

Next, an exemplary method for correcting the skew regarding the digitizer apparatus 500 is described.

Here, it is assumed that the first digital filter 522 and the second digital filter 524 are FIR filter, where function h(t) denotes the filter coefficient. In this case, the impulse response of the first digital filter 522, letting T be a sampling interval of the AD converter 110 is represented as the following equation(19):

$$h(t) \sum_{k=0}^{N-1} \delta(t - kT) = \sum_{k=0}^{N-1} h(kT)\delta(t - kT). \tag{19}$$

Here, the filter coefficient of the first digital filter 522 is h(k·T)(k=0, 1, . . . , N−1).

The correcting filter coefficient generator 526 generates the correcting filter coefficient correcting the skew τ, besides a waveform of the impulse response of the correcting filter coefficient is same as the first digital filter 522, on the basis of the filter coefficient of the a first digital filter 522 and the skew τ. The impulse response of the second digital filter 524 by the correcting filter coefficient is represented as the following equation(20):

$$h(t) \sum_{k=0}^{N-1} \delta(t - kT - \tau) = \sum_{k=0}^{N-1} h(kT - \tau)\delta(t - kT - \tau). \tag{20}$$

According to the correcting filter coefficient h(k-T-τ) shown in equation(20), the second digital filter 524 can correct the digital Q signal delayed by the skew τ relative to the digital I signal to output with the same sampling timing as the digital I signal.

In addition, with regard to analog input unit 101 and the AD converter 110, an error in amplitude and/or direct current components of output value of the digital I signal against the digital Q signal and the digital Q input signal against the analog I input signal may arise. That is, with regard to equation(20), an impulse function δ' (t−kT−τT), where the error in amplitude and direct current components arise, is represented as the following equation(21):

$$\delta'(t-kT-\tau)=\alpha\delta(t-kT-\tau)+\beta \tag{21}$$

From equations(20) and (21), a filter function of the second digital filter 524 correcting the error in amplitude and direct current components is represented as the following equation(22):

$$\sum_{k=0}^{N-1} h(kT - \tau)\frac{1}{\alpha}\{\delta'(t - kT - \tau) - \beta\} = \tag{22}$$

$$\sum_{k=0}^{N-1} \frac{1}{\alpha}h(kT - \tau)\delta'(t - kT - \tau) = \sum_{k=0}^{N-1} \left(-\frac{\beta}{\alpha}\right)h(kT - \tau)$$

In order to correct the phase errors, the error in amplitude and the error in direct current components with equation (22), the digitizer apparatus 500 may be configured as following. The skew measuring unit 532 operates as an error measuring unit measuring the error in amplitude α and the error in direct current components β as well as the phase error τ. The correcting filter coefficient generator 526 generates 1/·h(kT−τ) in equation(22) as the correcting filter coefficient, while generating integer components, the second term in equation(22), as a part of the correcting filter coefficient. The second digital filter 524 converts the digital Q signal using equation (22) on the basis of the correcting filter coefficient generated by the correcting filter coefficient generator 526 and generates the converted digital Q signal.

Here, with regard to the skew measuring unit 532 operating as the error measuring unit, a difference between the output values of the digital I signal and the digital Q signal, in case the reference signal that is zero in analog value inputted to the AD converter 110, may be the error in direct current components β. And, a ratio of an average for amplitude of the digital I signal and the digital Q signal, in case more than a kind of the reference signal inputted to the AD converter 110, may be the error in amplitude α.

Figure 6:
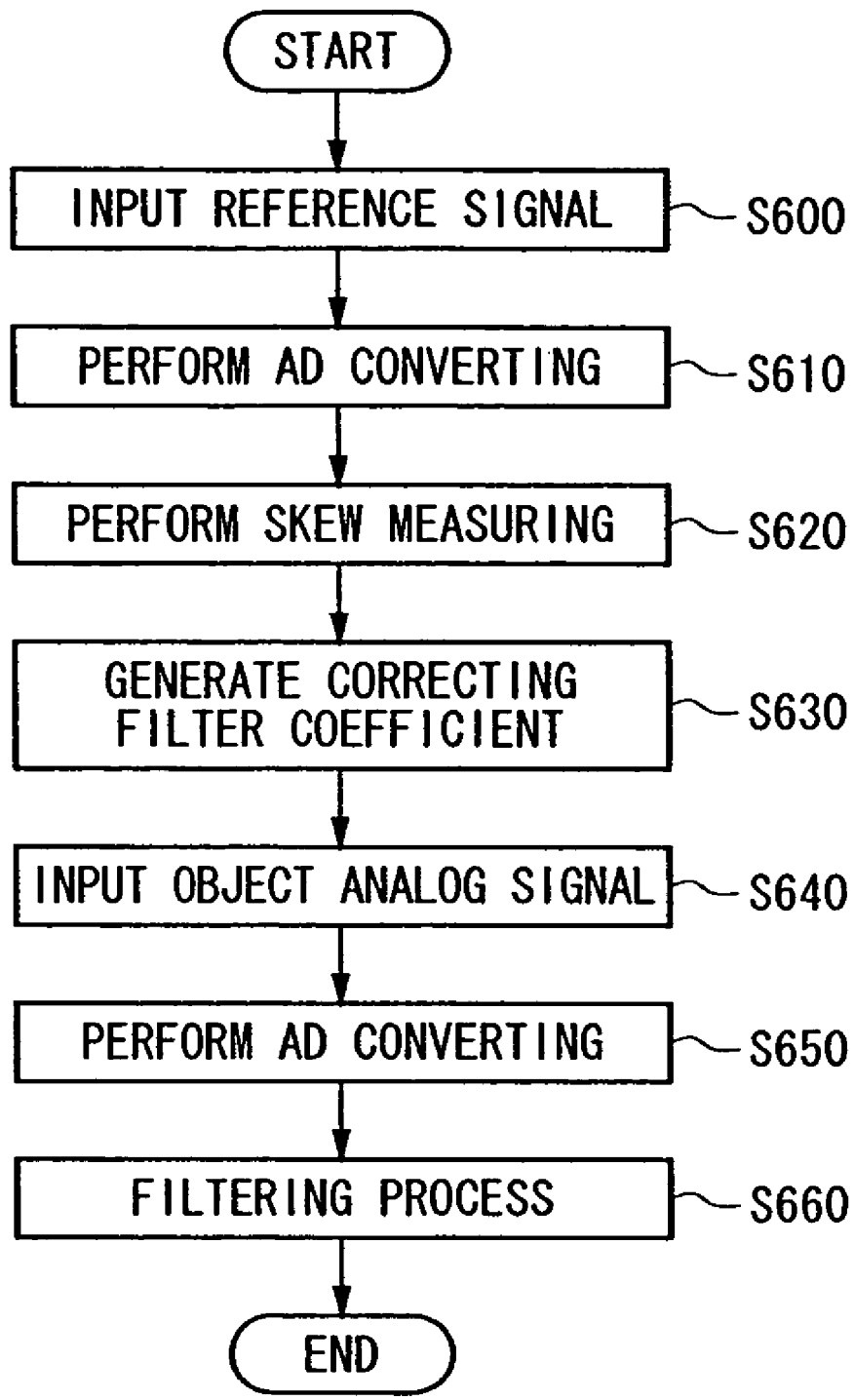
FIG. 6 shows a process flow of a digitizer apparatus 500 relating to the third exemplary embodiment of the present invention.

FIG. 6 shows a process flow of a digitizer apparatus 500 relating to the third exemplary embodiment of the present invention.

First, in order to measure the skew of the sample timing of the first AD converter 114 and the second AD converter 116, the reference signal generator 102 inputs the reference signal to the first AD converter 114 via the multiplexer 104 and the first analog unit 106 and inputs the same reference signal to the second AD converter 116 via the multiplexer 105 and the second analog unit 108(S600). The first AD converter 114 and the second AD converter 116 convert the reference signal inputted into the digital I signal and the digital Q signal respectively (S610). The skew measuring unit 532 measures the skew on the basis of an amount of the phase difference between the digital I signal and the digital Q signal (S620).

Next, the correcting filter coefficient generator 526 generates the correcting filter coefficient correcting the skew, besides the waveform of the impulse response of the correcting filter coefficient is same as the first digital filter 522, on the basis of the skew measured by the skew measuring unit 132 and the filter coefficient set in the first digital filter 522(S630).

Next, the AD converter 110 inputs the analog I signal via the multiplexer 104 and the first analog unit 106, while inputting the analog Q signal via the multiplexer 105 and the second analog unit 108(S640). And, the first AD converter 114 and the second AD converter 116 in the AD converter 110 sample a pair of analog signals inputted and convert to the digital I signal and the digital Q signal respectively (S650).

Next, the first digital filter 522 converts the digital I signal inputted by the first AD converter 114 on the basis of the predetermined the filter coefficient and generates the converted digital I signal. And, the first digital filter 522 converts the digital Q signal inputted by the AD converter 110 on the basis of the correcting filter coefficient generated by the correcting filter coefficient generator 526 and generates the converted digital Q signal (S660).

According to the digitizer apparatus 500 described above, the skew of sampling with which a pair of analog signals are sampled by the AD converter 110 can be corrected by changing at least one of a pair of the filter coefficients used for filtering a pair of digital signals sampled. And, a magnitude of the skew during operation is measured by the reference signal generator 102 and the skew measuring unit 532 and the correcting filter coefficient can be adjusted using the magnitude of the skew measured so that the digitizer apparatus 500 with high precision can be achieved.

Figure 7:
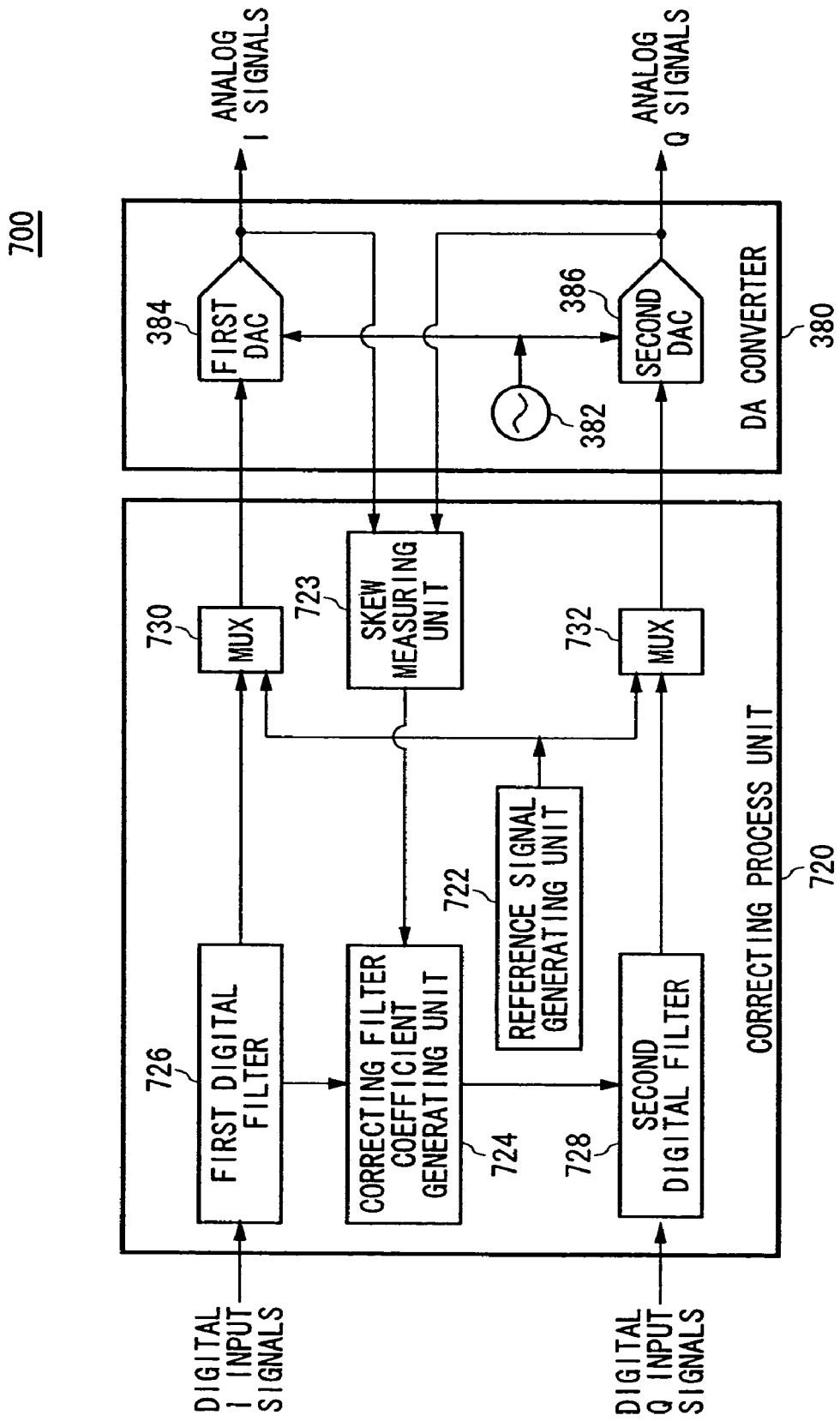
FIG. 7 shows a configuration of a waveform generating apparatus 700 relating to the fourth exemplary embodiment of the present invention.

FIG. 7 shows a configuration of a waveform generating apparatus 700 relating to the fourth exemplary embodiment of the present invention. The waveform generating apparatus 700 inputs a pair of digital input signals to be converted into analog signals, which should be synchronized, and converts and outputs a pair of analog signals synchronized. With regard to this conversion, the waveform generating apparatus 700 prevents the impairment of quality of signal during converting a pair of digital input signal into analog signals by correcting an error of converting timing with which a pair of digital input signal are converted into the analog signals respectively by a digital filter. The waveform generating apparatus 700 includes a correcting process unit 720 and a DA converter 380. Description about the DA converter 380 regarding FIG. 7 is omitted, since the DA converter 380 has the same configuration as the DA converter 380 shown in FIG. 3.

The correcting process unit 720 inputs a digital I input signal and a digital Q input signal in quadrature each other, an example of a pair of digital input signals to be converted into the analog signals synchronized. The correcting process unit 720 includes a reference signal generator 722, a skew measuring unit 723, a first digital filter 726, a correcting filter coefficient generator 724, a second digital filter 728, a multiplexer 730 and a multiplexer 732.

The reference signal generator 722, which has the same configuration as the reference signal generator 322, generates a reference signal, which the skew measuring unit 723 uses to measure a skew of timing with which a pair of digital input signals are converted by the DA converter 380. The skew measuring unit 723, which has the same configuration as the reference signal generator 323, measures the skew of timing with which a pair of digital signal outputted by the correcting process unit 720 to the DA converter 380 are converted by the DA converter 380, and provides the skew to the correcting filter coefficient generator 724. The skew measuring unit 723 according to this exemplary embodiment, in case the same reference signal generated by the reference signal generator 722 is inputted to the DA converter 380, measure the skew on the basis of an amount of a phase difference between a analog I signal and a analog Q signal outputted by the first DA converter 384 and the second DA converter 386 in the DA converter 380, an example of the first analog signal and the second analog signal.

The first digital filter 726, which has the same configuration as the first digital filter 522 regarding FIG. 5, converts the digital I input signal representing a signal value of the analog I signal to be outputted by the waveform generating apparatus 700 on the basis of a predetermined first filter coefficient, and generates a converted digital I signal, an example of a first converted signal.

The correcting filter coefficient generator 724, which has the same configuration as the correcting filter coefficient generator 526 regarding FIG. 5, generates a second filter coefficient correcting the skew, besides a waveform of the impulse response of the second filter coefficient is same as the first digital filter 522, on the basis of the skew of timing with which the analog I signal and the analog Q signal are converted by the DA converter 380 and a first filter coefficient, and sets in the second digital filter 728.

The second digital filter 728, which has the same configuration as the second digital filter 524 regarding FIG. 5, converts the digital Q input signal representing a signal value of the analog Q signal to be outputted by the waveform generating apparatus 700 on the basis of a second filter coefficient, and generates a converted digital Q signal, an example of a second converted signal.

The multiplexer 730 and the multiplexer 732 input the same reference signal to the DA converter 380, in case the skew measuring unit 723 measures the skew. Meanwhile, in case the waveform generating apparatus 700 outputs an analog I signal and an analog Q signal corresponding to the digital I input signal and the digital Q input signal via the DA converter 380, the converted digital I signal and the converted digital Q signal are inputted to the DA converter 380.

Figure 8:
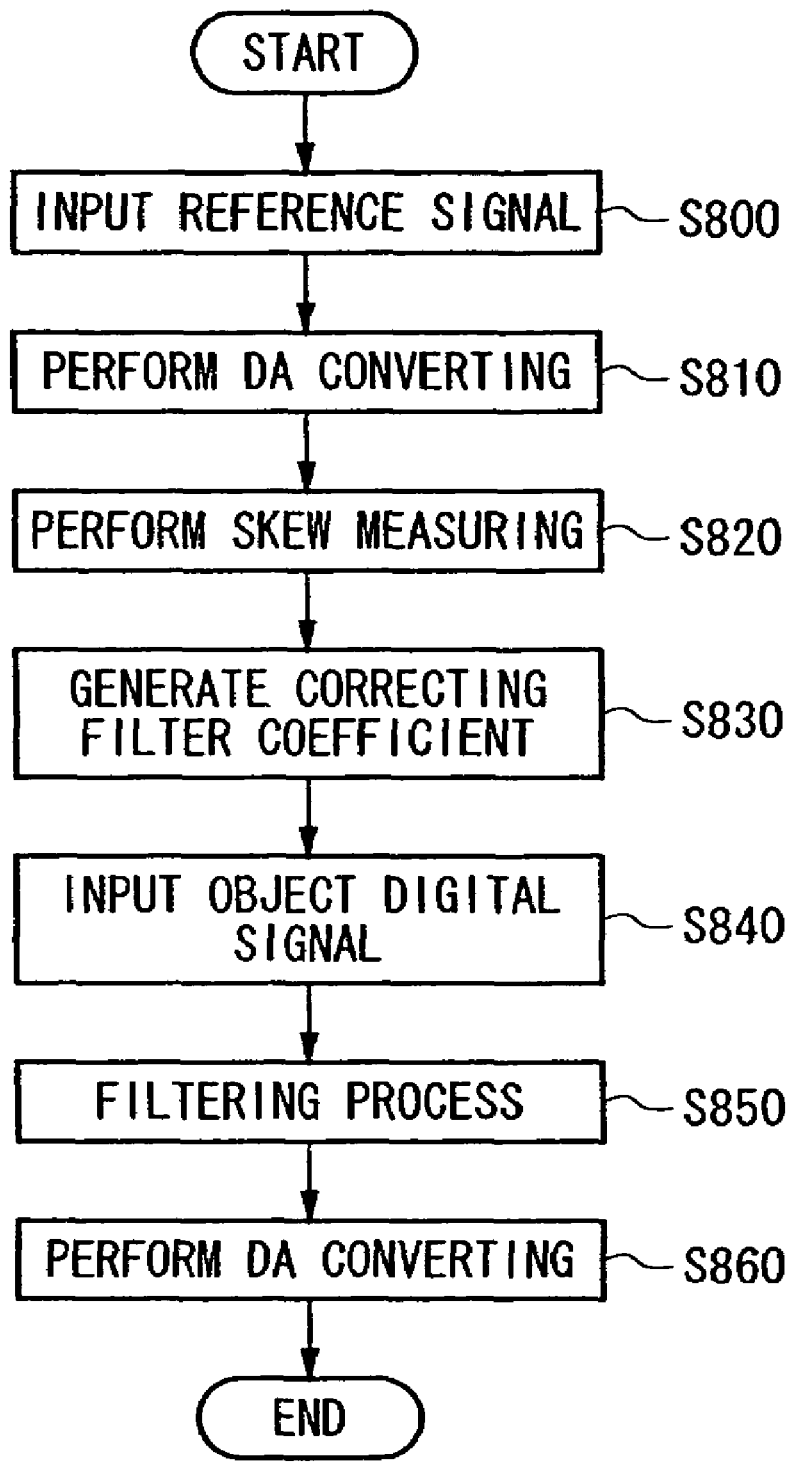
FIG. 8 shows a process flow of a waveform generating apparatus 700 relating to the fourth exemplary embodiment of the present invention.

FIG. 8 shows a process flow of a waveform generating apparatus 700 relating to the fourth exemplary embodiment of the present invention.

First, in order to measure the skew of converting timing of the first DA converter 384 and the second DA converter 386, the reference signal generator 722 inputs the same reference signal to the first DA converter 384 and the second DA converter 386 via the multiplexer 730 and the multiplexer 732(S800). The first DA converter 384 and the second DA converter 386 convert the reference signal inputted into the analog I signal and the analog Q signal respectively (S810). The skew measuring unit 723 measures the skew on the basis of an amount of the phase difference between the analog I signal and the analog Q signal (S820). And, the correcting filter coefficient generator 724 generates the second filter coefficient correcting the skew, besides the waveform of the impulse response of the second filter coefficient is same as the first digital filter 522, on the basis of the skew measured by the skew measuring unit 723 and the first filter coefficient, and sets in the second digital filter 728(S830).

Next, the first digital filter 726 and the second digital filter 728 input the digital I input signal and the digital Q input signal respectively, which should be converted into the analog signals synchronized (S840). The first digital filter 726 converts the digital I input signal on the basis of the first filter coefficient, and generates the converted digital I signal. The second digital filter 728 converts the digital Q input signal on the basis of the second filter coefficient generated by the correcting filter coefficient generator 724, and generates the converted digital Q signal (S850). The first DA converter 384 and the second DA converter 386 convert the converted digital I signal and the converted digital Q signal on which the skew is corrected into the analog I signal and the analog Q signal respectively (S860).

In this regard, description of a method for correcting the skew regarding the correcting filter coefficient generator 724, the first digital filter 726 and the second digital filter 728 will be omitted, since the method is same as described with regard to FIG. 6 using equations (19) and (20).

According to the digitizer apparatus 700 described above, the skew of sampling with which the DA converter 380 converts to a pair of synchronous analog signals can be corrected by digital filtering digital signals corresponding to the analog signals to be outputted in the frequency domain. And, a magnitude of the skew during operation is measured by the reference signal generator 722 and the skew measuring unit 723 and an amount of the correction can be adjusted using the magnitude of the skew measured so that the digitizer apparatus 700 with high precision can be achieved.

Figure 9:
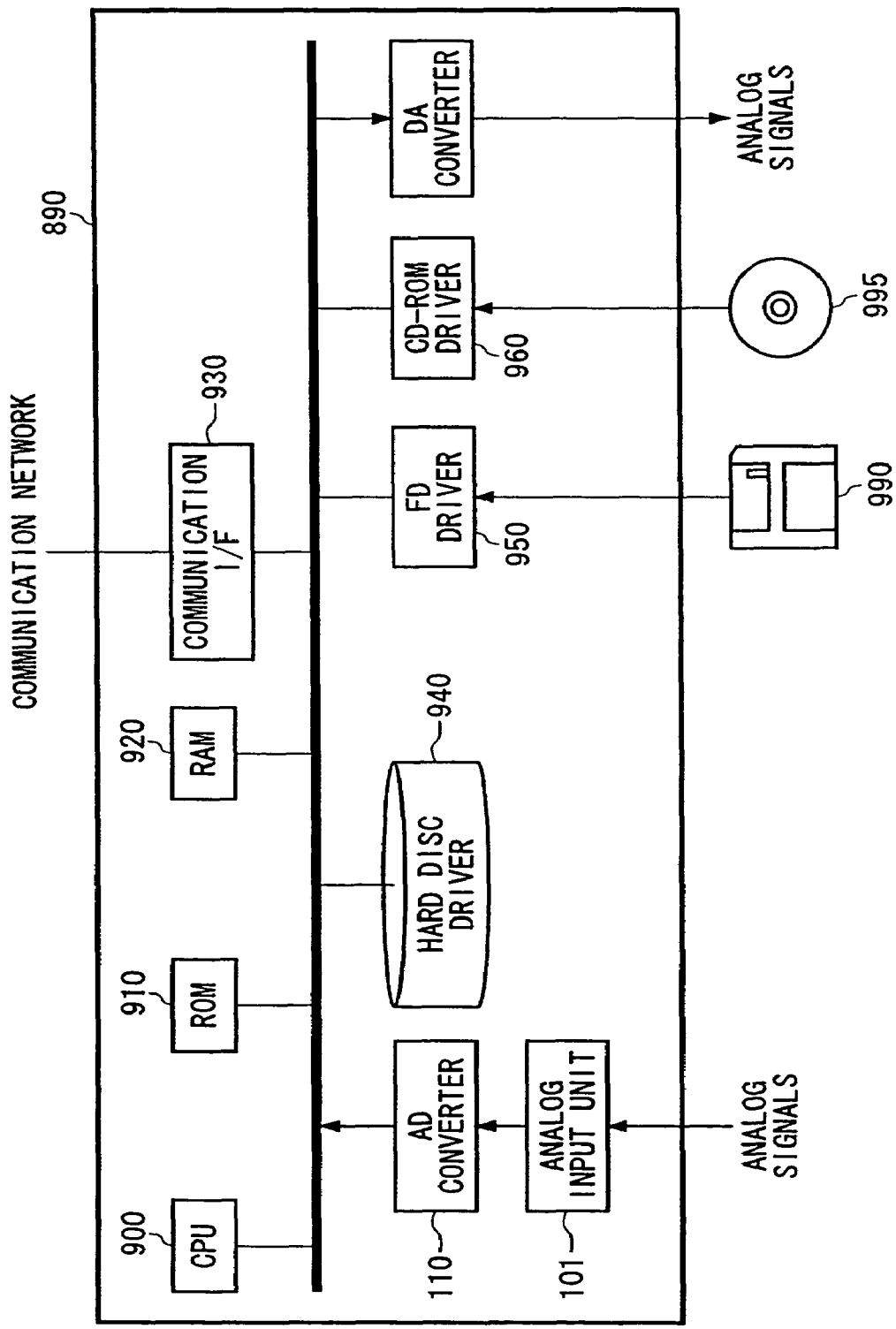
FIG. 9 shows an exemplary hardware configuration of a digitizer apparatus 100, a waveform generating apparatus 300, a digitizer apparatus 500 and/or a waveform generating apparatus 700 relating to an exemplary embodiment of the present invention.

FIG. 9 shows an exemplary hardware configuration of a digitizer apparatus 100, a waveform generating apparatus 300, a digitizer apparatus 500 and/or a waveform generating apparatus 700 relating to an exemplary embodiment of the present invention. The digitizer apparatus 100, the waveform generating apparatus 300, the digitizer apparatus 500 and/or the waveform generating apparatus 700, according to this exemplary embodiment of the present invention, include a CPU 900, a ROM 910, a RAM 920, a communication interface 930, a hard disc driver 940, a flexible disc driver 950 and a CD-ROM driver 960, and are implemented by the information processing apparatus 890 coupled to the AD converter 110 and/or the DA converter 380 via the analog input unit 101

The CPU 900 operates on the basis of programs installed in the ROM 910 and the RAM 920, and controls each parts. The ROM 910 contains a boot program executed by the CPU 900 when the information processing apparatus 890 drives or programs depending on hardware of the information processing apparatus 890. The RAM 920 contains programs executed by the CPU 900 and data used by the CPU 900. The communication interface 930 communicates other apparatuses via communication networks. The hard disc driver 940 contains programs and data used by the information processing apparatus 890 and provides the programs and data to the CPU 900 via RAM 920. The flexible disc driver 950 reads programs or data from a flexible disc 990 and provides the programs or data to the RAM 920. The CD-ROM driver 960 reads programs or data from a CD-ROM 995 and provides the programs or data to the RAM 920.

Programs provided to the CPU 900 via the RAM 920 are contained in a recording medium such as the flexible disc 990, the CD-ROM 995 or a IC card and provided to a user. The programs are read from the recording medium, installed in the information processing apparatus 890 via the RAM 920 and executed for the information processing apparatus 890.

A program, which is installed in the information processing apparatus 890, executed and allows the information processing apparatus 890 to function as the digitizer apparatus 100, includes a first signal frequency component calculating module, a second signal frequency component calculating module, a skew frequency component calculating module, a first signal frequency correcting module, a second signal frequency correcting module, a skew measuring module, a corrected first signal calculating module and a corrected second signal calculating module. These program or modules allow the information processing apparatus 890 to function as a first signal frequency component calculating unit 122, a second signal frequency component calculating unit 124, a skew frequency component calculating unit 126, a first signal frequency correcting unit 128, a second signal frequency correcting unit 130, a skew measuring unit 132, a corrected first signal calculating unit 140 and a corrected second signal calculating unit 142 respectively.

A program, which is installed in the information processing apparatus 890, executed and allows the information processing apparatus 890 to function as the waveform generating apparatus 300, includes a reference signal generating module, a skew measuring module, a first signal frequency component calculating module, a second signal frequency component calculating module, a skew frequency component calculating module, a first signal frequency component correcting module, a second signal frequency component correcting module, a first digital signal calculate module and a second digital signal calculate module. These program or modules allow the information processing apparatus 890 to function as a reference signal generator 322, a skew measuring unit 323, a first signal frequency component calculating unit 324, a second signal frequency component calculating unit 325, a skew frequency component calculating unit 326, a first signal frequency component correcting unit 328, a second signal frequency component correcting unit 330, a first digital signal calculating unit 332 and a second digital signal calculating unit 334 respectively.

A program, which is installed in the information processing apparatus 890, executed and allows the information processing apparatus 890 to function as the digitizer apparatus 500, includes a first digital filter module, a second digital filter module, a correcting filter coefficient generating module and a skew measuring module. These program or modules allows the information processing apparatus 890 to function as a first digital filter 522, a second digital filter 524, a correcting filter coefficient generator 526 and a skew measuring unit 532 respectively.

A program, which is installed in the information processing apparatus 890, executed and allows the information processing apparatus 890 to function as the waveform generating apparatus 700, includes a reference signal generating module, a skew measuring module, a correcting filter coefficient generating module, a first digital filter module and second digital filter module. These program or modules allows the information processing apparatus 890 to function as a reference signal generator 722, a skew measuring unit 723, a correcting filter coefficient generator 724, a first digital filter 726 and a second digital filter 728.

The programs and modules described above may be contained an external recording medium. As the recording medium, an optical recording medium such as a DVD or a PD as well as the flexible disc 990 and the CD-ROM 995, an optical magnetic recording medium such as MD, a tape medium and semiconductor memory such as the IC card can be used. And, the programs may be provided from an external network to the information processing apparatus 890 via the communication network by using memory devices such as a hard disc or a RAM installed in a server system connected to a leased communication network or internet as the recording medium.

Although the present invention has been described by way of exemplary embodiments, it should be understood that those skilled in the art might make many changes and substitutions without departing from the spirit and the scope of the present invention, which is defined by the appended claims.

For example, a pair of analog input signals inputted by the digitizer apparatus 100 or the digitizer apparatus 500 or a pair of analog signals generated by the waveform generating apparatus 300 or the waveform generating apparatus 700 are not limited to quadrature signals and may be any kinds of synchronous analog signals.

It is apparent from the description above that, according to the present invention, a difference of sample timing or converting timing between a pair of signals to be synchronized is suppressed so that a digitizer module, a waveform generating module, a converting method and a waveform generating method, preventing an impairment of quality of signal, and a recording medium for recording a program thereof can be achieved.

What is claimed is:

1. A waveform generating module for outputting a pair of synchronous analog signals, comprising:
   a first digital filter for generating a first converted signal into which a first digital signal, which represents a signal value of a first analog signal to be outputted, is converted on the basis of a first filter coefficient;
   a second digital filter for generating a second converted signal into which a second digital signal, which represents a signal value of a second analog signal to be outputted, is converted on the basis of a second filter coefficient;

a DA converter for converting said first and second digital signals into said first and second analog signals at a predetermined time interval respectively; and a correcting filter coefficient generator for generating said second filter coefficient correcting a skew, besides a waveform of an impulse response of said correcting filter coefficient is same as said first digital filter, on the basis of said skew of a timing with which said DA converter converts said first and second digital signals into said first and second analog signals and said first filter coefficient.

2. A waveform generating module as claimed in claim 1, wherein said correcting filter coefficient generator makes said second filter coefficient be $h(k \cdot T - \tau)$, in case said first filter coefficient is $h(k \cdot T)$ and said converting timing error is $\tau$, where said first digital filter has at least two said first filter coefficient, k denotes an integer in a range of zero to a number one less than the number of said first filter coefficient and T denotes a converting interval of said DA converter.

3. A recording medium for recording a program used for a waveform generating module outputting a pair of synchronous analog signals, wherein said waveform generating module comprises a DA converter for converting a first and second digital signals into a first and second analog signals at a predetermined time interval respectively, and said program allows said waveform generating module to function with:

a first digital filter for generating a first converted signal into which a first digital signal, which represents a signal value of said first analog signal to be outputted, is converted on the basis of a first filter coefficient;

a second digital filter for generating a second converted signal into which a second digital signal, which represents a signal value of said second analog signal to be outputted, is converted on the basis of a second filter coefficient; and a correcting filter coefficient generator for generating said second filter coefficient correcting a skew, besides a waveform of an impulse response of said correcting filter coefficient is same as said first digital filter, on the basis of said skew of a timing with which said first and second digital signals converted into said first and second analog signals by said DA converter and said first filter coefficient.

4. A waveform generating method for outputting a pair of synchronous analog signals, comprising the steps of:

generating a first converted signal into which a first digital signal, which represents a signal value of a first analog signal to be outputted, is converted on the basis of a first filter coefficient;

generating a second converted signal into which a second digital signal, which represents a signal value of a second analog signal to be outputted, is converted on the basis of a second filter coefficient;

converting said first and second digital signals into said first and second analog signals at a predetermined time interval respectively; and generating said second filter coefficient correcting a skew, besides a waveform of an impulse response of said second filter coefficient is same as said first digital filter, on the basis of said skew of a timing with which said first and second digital signals converted into said first and second analog signals during said step of converting and said first filter coefficient.

* * * * *